(12) United States Patent
Tsai et al.

(10) Patent No.: US 7,283,944 B2
(45) Date of Patent: Oct. 16, 2007

(54) CIRCUIT SIMULATION BUS TRANSACTION ANALYSIS

(75) Inventors: Jien-Shen Tsai, Taipei (TW); Nan-Ting Yeh, Kao-Hsiung (TW); Mou-Tien Lu, Hsin-Chu (TW); Chung-Chia Chen, Hsin-Chu Hsien (TW); Shih-Fang Hsiao, Hsin-Chu Hsien (TW); Gwo-Ching Lin, Tai-Chung (TW); Sheng-Chiang Chen, Miao-Li Hsien (TW)

(73) Assignee: Springsoft, Inc., Hsinchu (TW)

( * ) Notice: Subject to any disclaimer, the term of this patent is extended or adjusted under 35 U.S.C. 154(b) by 658 days.

(21) Appl. No.: 10/737,154

(22) Filed: Dec. 15, 2003

(65) Prior Publication Data

US 2005/0131666 A1 Jun. 16, 2005

(51) Int. Cl.
*G06F 17/50* (2006.01)
*G06F 13/00* (2006.01)

(52) U.S. Cl. .............................. 703/15; 703/2; 703/22; 710/105

(58) Field of Classification Search .................... 703/2, 703/13, 22, 15; 710/105, 305; 705/52
See application file for complete search history.

(56) References Cited

U.S. PATENT DOCUMENTS 6,188,975 B1 * 2/2001 Gay ............................ 703/22
7,130,942 B2 * 10/2006 Gemelli et al. ............. 710/105
2004/0249757 A1 * 12/2004 Walmsley et al. ............ 705/52

OTHER PUBLICATIONS

Material Appearing on Structured Design Verification Website, (http:www.sdvinc.com) as of Dec. 9, 2003, no specific papers, INF.

* cited by examiner

*Primary Examiner*—Thai Phan
(74) *Attorney, Agent, or Firm*—Daniel J. Bedell; Smith-Hill and Bedell

(57) ABSTRACT

While simulating a circuit described by the netlist, a circuit simulator produces a dump file containing a set of waveform data sequences, each corresponding to a separate signal within the circuit, and representing states of its corresponding signal at a succession of times during the circuit simulation. Based on a mapping of the waveform data sequences to lines of a bus, and on transaction data models describing characteristic signal patterns appearing on the bus during each type of transaction that can occur on the bus, a transaction analysis system identifies transactions that occurred on the bus during the simulation. The transaction analysis system also notes a time during the circuit simulation in which each transaction occurred, and generates a display including a separate representation of each identified transaction positioned to represent the time the transaction occurred.

24 Claims, 4 Drawing Sheets

CIRCUIT SIMULATION BUS TRANSACTION ANALYSIS

BACKGROUND OF THE INVENTION

1. Field of the Invention

The invention relates to circuit simulators and in particular to a system for processing simulator output data representing behavior of a simulated circuit's individual signals to produce descriptions of transactions occurring on a bus conveying those signals.

2. Description of Related Art

Hierarchical IC Designs

An IC designer typically generates a hardware description language (HDL) netlist describing an IC in terms of the logical relationships between the various signals conveyed by networks ("nets") within the IC. The designer then uses a synthesis tool to convert the HDL level netlist into a gate level netlist describing the IC as an interconnected set of standard logic gates and other IC components ("cells") that are to implement the logic described by the HDL netlist. The designer then uses placement and routing tools to generate an IC layout specifying a position of each cell within the IC and specifying how the nets are to be routed between the cells' terminals.

A hierarchical netlist organizes an IC's cells into low level modules and organizes low-level modules into larger, progressively higher-level modules. For example, a collection of interconnected gate cells might form a counter module, the counter module may form a part of a higher-level arithmetic logic unit (ALU) module, and the ALU module may form a part of a higher-level central processing unit (CPU) module. At the highest level of the design hierarchy, an IC may include several large modules such as memories, peripheral device controllers, and the like that communicate with the CPU. The hierarchical nature of the netlist makes it easier for a designer to comprehend an IC design, because it is easier for him or her to think of an IC as being a set of high-level modules, each having a clearly recognizable high-level function, than as merely a collection of interconnected low-level cells.

Buses and Bus Transactions

The cells at the lowest level of the design hierarchy communicate with one another through individual signals conveyed on nets interconnecting the cells' input and output terminals. But designers often think of modules at higher levels of the design hierarchy as communicating with one another though buses. A bus is a set of nets conveying a collection of interrelated signals working together to convey information. For example, a conventional computer bus might include several nets for conveying separate bits of a data, address and control data words and a clock signal. The control signals may indicate, for example, whether the data is to be read out of or written to the address. Clock signal edges indicate when the other signals are at valid logic levels. Designers call the process of transfer data between modules via a bus a "bus transaction". Thus a bus can be viewed as the individual nets ("bus lines") needed to convey all of the signals the modules need for carrying out a set of bus transactions between the modules.

Depending on the nature of the bus transactions carried out over a bus, the number of lines the bus may require can range from as little as one to several dozen or more. When the only transaction to be carried out is to convey the state of a single bit, the bus may need only a single data signal line. However, if the data signal is to be sampled by a receiving module at particular times, the bus may also require a clock signal line for controlling sampling. A simple parallel computer bus allowing a central processing unit (CPU) to read and write access storage locations in a random access memory might include, for example, 16 data lines, 16 address lines, a set of control lines and a clock line. Many types of transactions can occur on a bus and with each type of transaction involving a characteristic signaling protocol.

Simulation

At each step of the design process, the IC designer will normally employ various tools to verify that the IC (or some selected portion of it) described by the netlist will behave as expected. For example, a computer-based circuit simulator simulates the behavior of an IC described by a netlist in response to a set of input signals and generates a "dump file" containing waveform data sequences describing how the IC's input, output and internal signals behave. The waveform data sequence for each signal indicates the state of the signal at a succession of times relative to edges of a clock signal controlling the timing of state changes in that signal. Conventional waveform display software can then process the waveform data included in the dump file to produce a waveform display graphically depicting the states of selected IC signals as functions of time.

While a designer thinks of an IC as being a hierarchy of cells and modules, a typical simulator ignores the hierarchical nature of the IC design and models the IC simply by determining the behavior of each individual cell's output signal(s) to that cell's input signal(s). Similarly, while a designer may conceptualize several nets as forming a bus for conveying a sequence of bus transactions during a simulation, the circuit simulator determines only the behavior or each individual signal of the IC as a function of time and ignores the fact that a signal may conceptually form a part of a bus. Thus while the designer may think of some sets of signals as being buses and may think of various patterns of signals conveyed on those buses as being bus transactions, the simulator is only concerned with whether each individual signal is high or low at any given time. When a simulator creates a dump file during a simulation, the dump file may include waveform data representing the behavior of each individual signal of a bus, but will typically say nothing about the bus that the signals form and will provide no information regarding any transactions occurring on the bus. Though waveform display software can produce a waveform display depicting behavior of all of the signals forming a bus, the relationship between the states of those signals at any given time and the transaction they may represent will not always be readily apparent to the designer.

Nonetheless, when a designer wants to know whether the high-level modules that communicate though a bus behaved correctly during a simulation, the designer may want to know which bus transactions occurred on that bus and when they occurred during the simulation. The designer may be able to deduce the transactions carried out over a bus from the waveform display of the signals carried by the bus, but that can be a daunting task, particularly for large buses having complicated transaction protocols.

For example, devices forming components of a system-on-chip (SoC) within some ICs communicate with one another through buses conforming to an advance microcontroller bus architecture (AMBA) specification. An AMBA bus system includes two buses; a high-speed system bus for interconnecting embedded processors to high-performance peripherals, DMA controllers, on-chip memory and interfaces, and a peripheral bus linked to the system bus through a bridge for interconnecting ancillary or general-purpose peripherals. In an advanced high-performance (AHP) version of the high speed AMBA bus a device acting as "bus master" communicates with another device acting as "bus slave" by either writing data to or reading data from bus addresses within the slave. A bus transaction may include a sequence of one or more read or write phases ("bus transfers") relative to addresses residing within a portion of bus address space the slave occupies. A transaction can span many clock cycles, and since the duration of a given transaction depends partly on the speed with which individual slave devices acknowledge each bus transfer included in the transaction, the number of clock cycles a given transaction consumes can vary. Thus the signal pattern for a given bus transaction can vary depending on how long the master must wait between each bus transfer included in that bus transaction.

Since the AHP bus allows more than one device to act as bus master, the bus system includes an arbiter for resolving the bus masters' competing demands for bus access. To increase the efficiency of bus use, the bus arbitrator can time multiplex transactions initiated by different bus masters thereby interleaving bus transfers associated with transactions initiated by different bus masters. Thus the bus signal pattern produced by a given bus transaction not only varies depending on the speed with which a slave involved in the transaction can process each bus transfer, it also varies with the current level of demand for the bus by competing bus masters. The complexity of the transactions occurring on the AHP bus makes it virtually impossible for a designer to reliably decipher the dump file output of a simulator to determine which transactions occurred on that bus and when they occurred.

What is needed is a system for processing the dump file output of a simulator to determine which transactions occurred on an IC bus and to determine the timing with which each transaction occurred during a simulation of an IC. The system should also produce a display presenting relevant information about each transaction in an easily understood manner.

SUMMARY OF THE INVENTION

An integrated circuit (IC) described by a netlist may include one or more buses providing communication paths between various modules within the IC. The modules may carry out various data transfer transactions over each bus using a characteristic signaling protocol for each type of transaction. When simulating such an IC based on its netlist description, a circuit simulator produces a dump file containing a set of waveform data sequences, each corresponding to a separate signal within the IC and representing states of its corresponding signal at a succession of times during the circuit simulation.

A bus transaction analysis system in accordance with one aspect of the invention determines which waveform data sequences depict signals conveyed by the various lines of a bus implemented within the IC based on a user-supplied map. The bus transaction analysis system also determines the characteristic signaling pattern associated with each transaction and then analyzes the waveform data sequences to determine which transactions occurred on the bus during the simulation by determining when the transaction's characteristic signaling patterns appeared on the bus.

In accordance with another aspect of the invention, the bus transaction analysis system generates a display including a separate representation of each identified transaction with each representation positioned relative to a time base within in the display to represent the time during the simulation that the transaction occurred.

In accordance with a further aspect of the invention, each transaction is represented in the display by a corresponding index card, with the edges of each index card sized and positioned to represent starting and ending times of its corresponding transaction. Each index card indicates the name of its corresponding transaction and provides information about data transferred over the bus during the transaction. When a transaction has more than one phase, the index card for that transaction includes a graphical representation of each phase of the transaction positioned to indicate a time during the simulation that the transaction phase occurred.

In accordance with a further aspect of the invention, the display also includes successive data values conveyed over the bus during the transaction with the data values positioned to indicate times during the simulation at which the values were valid.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements

DETAILED DESCRIPTION OF THE INVENTION

The present invention relates to computer software stored on computer-readable media which, when read and executed by a conventional computer, causes the computer to process a dump file generated by a circuit simulator or similar device to produce data describing transactions occurring on a bus of a simulated circuit. Suitable computer-readable media for storing the software include, but are not limited to, compact disks, floppy disks, hard disks, and random access or read only memory. The invention can be viewed as either software stored on computer-readable media, or as a method carried out by the programmed computer. While the specification describes an exemplary embodiment of the invention considered a best mode of practicing the invention, those of skill in the art will understand that many aspects of the exemplary embodiment are matters of design choice, and that the invention may be practiced in other ways.

Design Process

Figure 1:
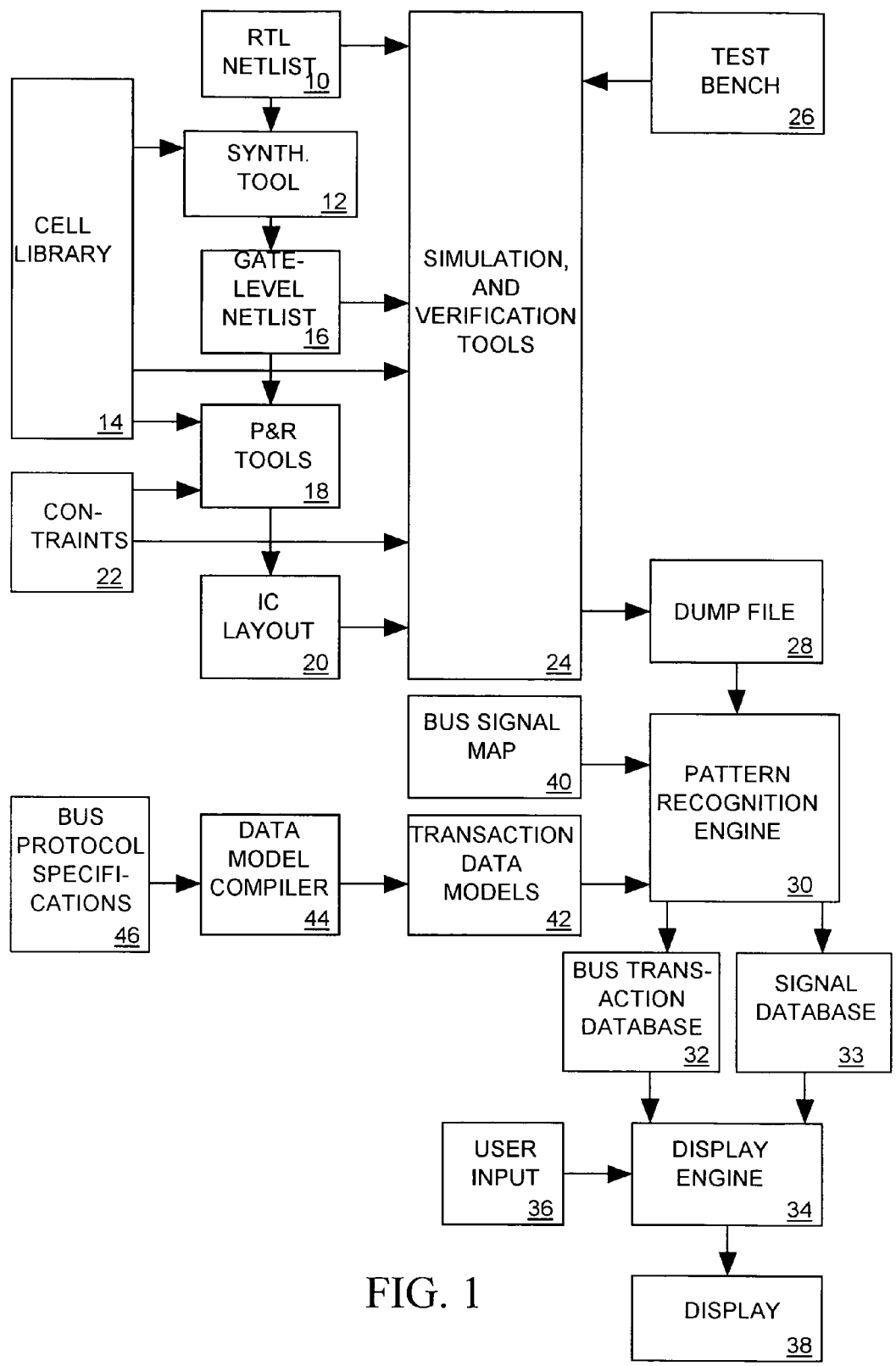
FIG. 1 is a data flow diagram depicting various stages an integrated circuit (IC) design process incorporating a bus transaction analysis system in accordance with the invention.

FIG. 1 is a data flow diagram depicting various stages an integrated circuit (IC) design process incorporating the invention. An IC designer generates a register transfer level (RTL) netlist 10 describing an IC in terms of the logical relationships between the various signals conveyed by networks ("nets") within the IC. RTL netlist 10 is hierarchical in nature, with various logic blocks grouped into modules, and with lower-level modules grouped into higher-level modules. After creating RTL netlist 10, the designer uses a synthesis tool 12 to convert it into a gate level netlist 14 describing the IC as a set of interconnected logic gates and other IC components ("cells") for implementing the logic blocks described by the RTL netlist. Synthesis tool 12 consults a cell library 14 describing each type of standard cell that may be included in the IC to determine which types of cells are to implement the logic RTL netlist 10 describes. Gate level netlist 16 will typically retain the hierarchical structure of the RTL netlist, wherein individual cells combine to form modules and low-level modules combine to form higher-level modules.

The designer then uses placement and routing (P&R) tools 18 to generate an IC layout 20 specifying a position of each cell within the IC and specifying how the nets are to be routed between the cells. Cell library 14 includes data defining the internal layout of each type of cell that may be included in the IC, and P&R tools 18 consult cell library 14 to determine the layout of each cell. P&R tools 18 try to generate an IC layout 20 satisfying various constraints 22 on the design, including limits on the area of IC the layout can occupy, limits on signal path delays and other constraints.

Following each of the RTL netlist, gate-level netlist and IC layout stages (10, 16 and 20) of the design process, the IC designer can employ various simulation and verification tools 24 to verify that the IC described at the present state of the design will meet constraints 22 and will behave as expected. When a simulator 24 is to simulate the IC, or some portion thereof, the designer provides a test bench 26 as input to the simulator indicating the time varying behavior of input signals to be applied to the simulated IC. Simulator 24 simulates the behavior of each of the individual cells of the portion of the IC being simulated based on behavior models of the cells provided by cell library 14. Simulator 24 then produces produce a "dump file" 28 containing waveform data sequences describing how states of the IC's individual input, output and internal signals change over time.

Bus Transactions

The logic blocks or cells at the lowest level of the design hierarchy described by the RTL or gate-level netlist communicate with one another through individual signals passing through nets interconnecting the cells' terminals. But just as a hierarchical netlist conceptually groups logically related cells into modules, it may also group nets conveying related signals passing between various logic blocks or cells of two or more separate modules into buses for conveying information between those modules. Designers refer to a transfer of data between two modules as a "bus transaction". Thus a bus can be viewed as a set of individual nets (or bus lines) linking two or more modules for conveying all of the signals the modules need for carrying out a set of transactions.

When a designer wants to know whether the high-level modules that communicate though a bus behaved correctly during a simulation, he or she will often want to know which bus transactions occurred on that bus and when each occurred during the simulation. But the simulator's dump file 28 does not mention anything about buses or bus transactions; it simply indicates the state of various signals at a succession of times during the simulation. The designer may be able to deduce the transactions occurring on a simple bus based on the succession of states of signals conveyed by the bus, if the designer knows which signals are included in the bus and knows the signal protocol for each type of transaction. When each transaction on a bus occurs in a single bus clock cycle and the bus has only a few lines, the task of deciphering the bus signals to determine the transactions carried out may be tedious, but not too difficult. However, the task of identifying bus transactions becomes considerable more difficult, for example, when the bus has a large number of lines, when bus transactions require more than one clock cycle, when bus transactions span variable numbers of clock cycles, and when bus transactions are time multiplexed on a bus. In such cases the signal patterns associated with each type of transaction become very complex and difficult for a human to recognize.

In accordance with the invention, a pattern recognition engine 30 processes the waveform data contained in dump file 28 to determine the sequence of transactions carried out on the IC's buses during the simulation and to store data describing each transaction in a bus transaction database 32. Pattern recognition engine 30 also generates entries in a signal database 33 each indicating each successive state or data value of a signal or group of related signals within each bus. For example, when the address lines of a parallel memory bus are treated as a signal group, pattern recognition engine 30 determines the sequence of addresses conveyed by that bus during the simulation and stores that sequence in signal database 33. Based on information stored in databases 32 and 33, a display engine 34, responding to user input 36, generates a display 38 depicting the transactions and associated signal states occurring on a user-selected bus in a manner that is easy for the user to understand.

Before pattern recognition engine 30 sequentially scans though the waveform data in dump file 28 looking for signal patterns matching bus transaction patterns, it consults a user-provided bus signal map 40 mapping each line of the bus to the waveform data in dump file 28 describing the particular signal conveyed by that bus line. Pattern recognition engine 30 also consults a set of transaction data models 42, each corresponding to a separate transaction and telling pattern recognition engine 30 how to recognize the corresponding transaction based on characteristic signal patterns appearing on the bus during the transaction. Each transaction data model 42 also tells pattern recognition engine 30 how to obtain and organize the data it is to record regarding the corresponding transaction in databases 32 and 33. The data model 42 for each transaction will provide the name of the bus, the name of the bus transaction, and, when a transaction has more than one identifiable data transfer phase, the name of each transaction phase. The data model 42 also indicates how the lines of the bus are organized into identifiable subsets, such as for example data, address and control lines, provides the name of each subset of the bus, and indicates how pattern recognition engine 30 is to determine the data value conveyed by each subset of the bus. A data model compiler 44 generates the data model 42 for each transaction based on information contained in a user-provided bus protocol specification 46. Bus protocol specification 46 contains the same information as transaction data models 42, but in a format more suitable for the designer to understand and modify when necessary.

Bus signal map 40 allows pattern recognition engine 30 to correlate each bus in the IC and the waveform data sequences for that bus to the data models 42 for that bus. In particular, bus signal map 40 lists each bus to be monitored, indicates the name of the bus as employed in the netlist, references the transaction data models 42 for that bus, and indicates which waveform data sequence in dump file 28 corresponds to each line of that bus type.

Figure 2:
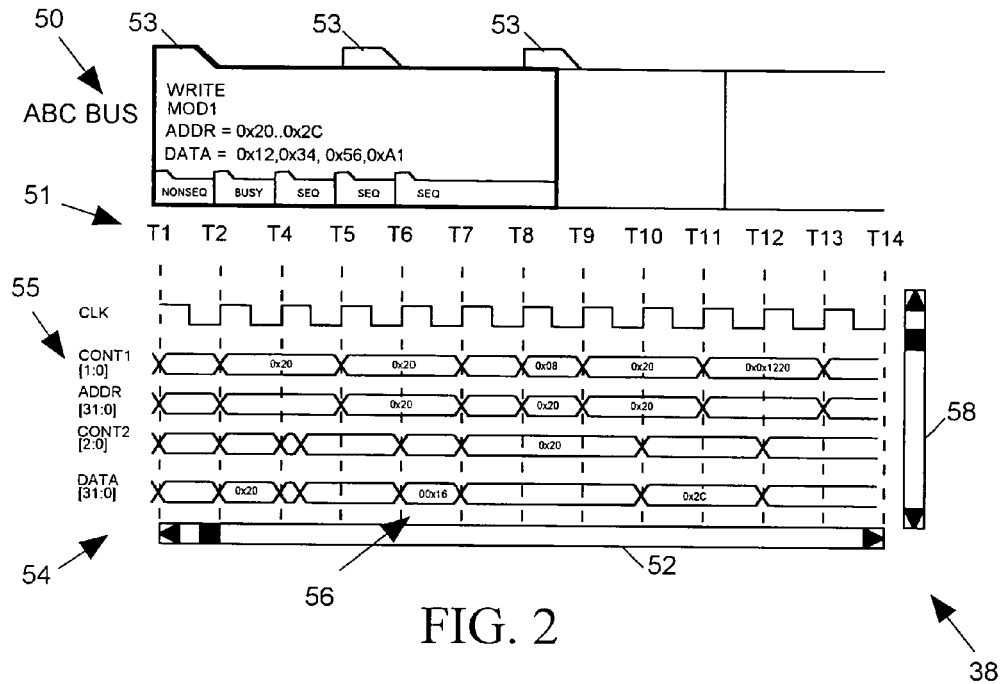
FIG. 2 depicts an example display generated by a bus transaction analysis system in accordance with the invention.

FIG. 2 depicts an example display 38 that display engine 34 of FIG. 1 might produce based on bus transaction data stored in database 32. The user selects the particular bus of interest and display engine 34 retrieves the transaction and signal data for that bus from bus transaction database 32 and signal database 33. Display 38 includes the bus name 50. A time base 51 references successive bus cycles occurring during the simulation, and a horizontal scroll bar 52 enables the user to scroll the display backwards and forwards in time. A separate tabbed index card 53 represents each transaction occurring on the bus and provides information about the transaction. The horizontal positions of the left and right edges of each index card 53 relative to time base 51 represent the beginning and ending times of the corresponding transaction. When a user mouse clicks on a tab of one of cards 53, that card moves to the top of the card stack so that the user can view the data contents of that index card.

Display 38 includes an area 54 for displaying graphical representations of the states or values of individual signals or groups of signals forming the selected, with each signal or group of signals being identified by its name 55. Individual signals are represented as waveform displays with edges positioned relative to time base 51 to represent timing of logic transition in those signals. Data values 56 indicating successive values of multiple-bit words (such as data, address and control words) represented by a subset of the signals of a bus is included in the signal display with the data values being positioned relative to time base 51 to indicate times at which the subset of signals conveyed those data values. Display 38 thus allows the user to easily determine which transactions occurred on the bus at any given time during the simulation, to determine relevant parameters of the transaction, and to determine states or values represented by various signals or groups of signals forming the bus at any given time during each transaction.

APPLICATION EXAMPLE

AMBA/AHP Bus

Figure 3:
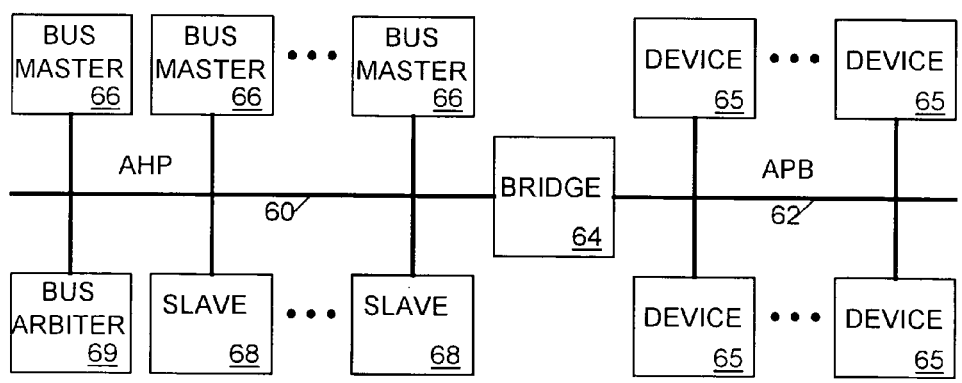
FIG. 3 depicts a prior art system-on-chip architecture in block diagram form.

Blocks 30-42 of FIG. 1 form a bus transaction recognition and display system in accordance with the invention that can determine the transactions occurring on any type of bus during a simulation based on the dump file output of a simulator. The well-known advance microcontroller bus architecture (AMBA) advanced high performance (AHP) bus is one example of a bus exhibiting relatively complex transaction patterns. As illustrated in FIG. 3, devices forming components of a system-on-chip (SoC) within many integrated circuits communicate with one another through buses conforming to the AMBA bus specification. An AMBA bus system includes two buses; a high-speed system bus 60 for interconnecting one or more embedded processors to high-performance peripherals such as DMA controllers, on-chip memory and interfaces, and a peripheral bus 62 linked to the system bus through a bridge 64 for interconnecting ancillary or general-purpose peripheral devices 65. In the advanced high-performance (AHP) version of the high speed AMBA bus 60, one or more devices 66 may act as "bus masters" able to communicate with other devices 68 acting as "bus slaves" by either writing data to or reading data from bus addresses controlled by the slaves. Each read or write phase of a transaction is called a "bus transfer", and a bus transaction may include a sequence of one or more bus transfers to an area of address space owned by a slave 68. A transaction can span many clock cycles, and since the duration of a given transaction depends partly on the speed with which individual slaves 68 acknowledged each bus transfer, the number of clock cycles a given transaction may consume can vary.

Since more than one device 66 can act as bus master, the AHP bus system includes a bus arbiter 69 for resolving the bus masters' competing demands for access to the AHP bus. To increase the efficiency of bus use, bus arbiter 69 can time multiplex transactions initiated by different bus masters 66 thereby interleaving bus transfers associated with transactions initiated by separate bus masters. Thus the duration of a transaction not only depends on the number of bus transfers to be carried out by the transaction and on the speed of the particular slave 68 involved in the transaction, but also on the current level demand for the bus by competing bus masters 66.

Every transaction on AHP bus 60 consists of an address and control phase and one or more data transfer phases. Each address phase is of a fixed duration and each slave 68 responds to a clock signal edges by sampling the bus address during each address phase to determine whether memory space in which it resides is to be read or write accessed and to determine the nature of the transfer. The duration of each data transfer phase is variable; the slave 68 occupying bus address accessed during a data phase asserts one of the bus signals to indicate the data transfer is complete, and various slaves requiring differing amounts of time to complete a data transfer. Arbiter 69 normally allows a master 66 carrying out the transaction to complete all the transfers in a particular transaction before granting another master 66 access to the bus. However, in order to avoid excessive arbitration latencies, it is possible for arbiter 69 to require a master 66 to re-arbitrate for access to the bus after each transfer in order to complete an entire transaction. Thus transactions carried out by different bus masters 66 can overlap with transfers forming portions of differing transactions being interleaved in time.

Figure 4:
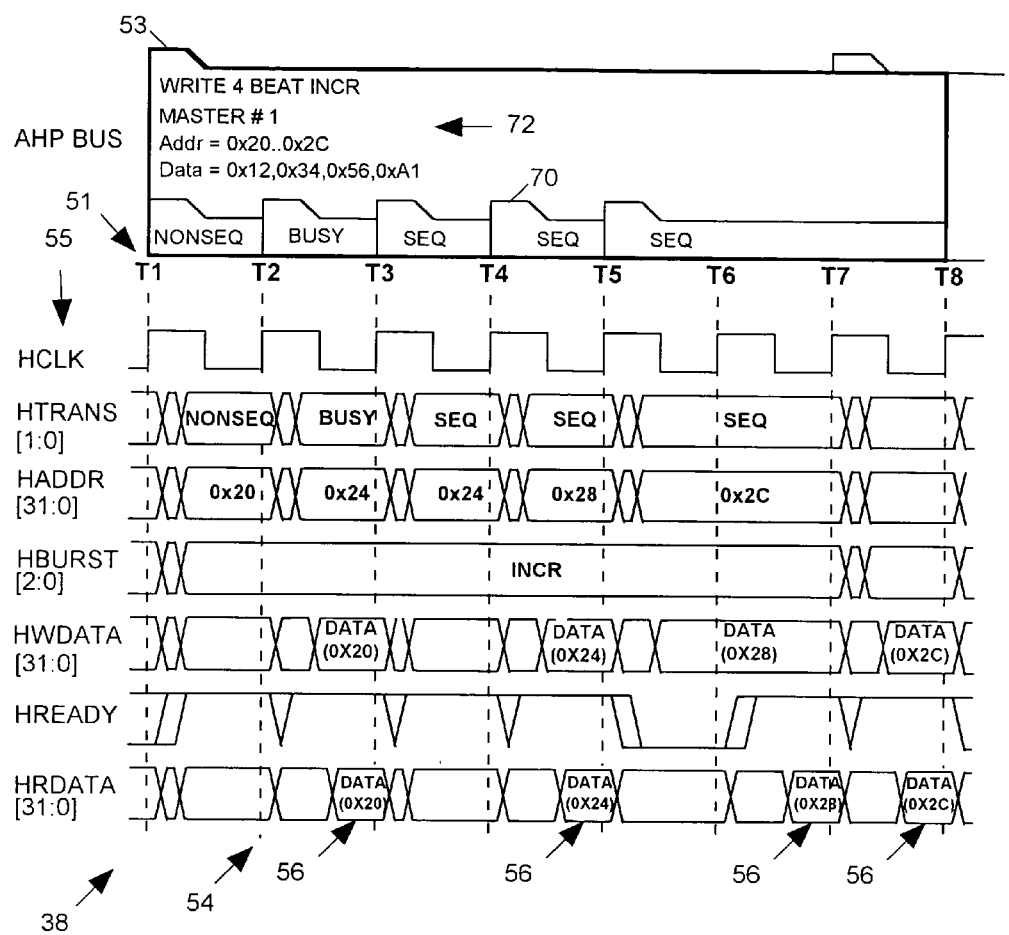
FIG. 4 depicts an expanded view of a portion of the display of FIG. 2.

FIG. 4 illustrates a portion of a display 30 of FIG. 1 display engine 34 might generate to depict a transaction on the AHB bus. The particular transaction displayed is a "WRITE_4_BEAT_INC" transaction wherein a particular bus master ("Master #1") writes data to four successive address of a slave. The display shows that the transaction occurred between simulation times T1 and T8 and involved one "non-sequential" bus phase, a "busy" bus phase, and three "sequential" bus phases represented by small phase cards 70 within the larger transaction card 53. Each phase card 70 is also sized and positioned relative to time base 51 so that its left and right edges represent the corresponding phases' starting and ending times during the transaction.

Data 72 displayed within transaction card 53 indicates the name of the transaction, the name of the bus master initiating the transaction, the bus addresses being accessed during the four data write cycles and the data written to those addresses. Display area 54 indicates the names 55 and states or values 56 of some of the signals or groups of signals forming the AHP bus, and the relative timing of signal state or value changes. The user can scroll the signal display to view displays of the other AHP bus signals. AHP bus 50 includes the following signals:

HCLK—a clock signal for timing all bus transfers.

HRESETn—a bus reset signal driven LOW to reset the bus system.

HADDR[31:0]—a 32-bit system address bus.

HTRANS[1:0]—two bits indicating transfer type (NON-SEQUENTIAL, SEQUENTIAL, IDLE or BUSY).

HWRITE—driven HIGH to indicate a write transfer and LOW to indicate a read transfer.

HSIZE[2:0]—three bits indicating transfer size, typically byte (8-bit), half word (16-bit) or word (32-bit) but may range up to 1024 bits.

HBURST[2:0]—three bits indicating burst size (1, 4, 8, 16) and whether bursts are incrementing or wrapping.

HPROT[3:0]—four bits typically indicating whether a transfer is an opcode fetch or data access, whether the transfer is a privileged mode access or user mode access, and whether the current access is cacheable or bufferable.

HWDATA[31:0]—a 32-bit write data bus.

HSELx—a separate signal for each slave x indicating whether the slave is involved in the current transfer (a decoding of the HADDR bus).

HRDATA[31:0]—a 32-bit read data bus.

HREADY—a slave drives this HIGH to indicate it has completed a data transfer.

HRESP[1:0]—two bits from slave indicating the current transfer status.

HBUSREQx—a separate signal from each bus master x to the bus arbiter requesting bus access.

HLOCKx—a separate signal from each bus master x to the bus arbiter driven high to indicate the master is requesting locked access to the bus and that no other master should be granted the bus until this signal is LOW.

HGRANTx—a separate signal from the bus arbiter to each bus master x granting that bus master access to the bus.

HMASTER[3:0]—four bits from the arbiter indicating which bus master is currently performing a transfer used by slaves supporting SPLIT transfers to determine which master is attempting an access.

HMASTLOCK—a signal from the bus arbiter indicating whether the current master is performing a locked transfer sequence.

HSPLITx[15:0]—sixteen bits from slave x to the bus arbiter indicating which of sixteen possible bus masters should be allowed to re-attempt a split transaction.

Bus signal map 40 of FIG. 1 tells pattern recognition engine 30 which waveform data sequences in dump file 28 represent each signal of the AHP bus and data model 42 indicates which signals are included in each signal group. Pattern recognition engine 30 stores a separate record in database 32 for each transaction including the following information:

the transaction name, the name, starting and ending times of each phase of the transaction, the arguments of the transaction including, in this example, the addresses accessed during the transaction and the data values written to those addresses, and an error flag indicating whether the transaction successfully completed without error.

Display engine 34 marks the transaction card 53 associated with any transaction failing to complete without error with a red error symbol. Pattern recognition engine 30 also stores a separate record in signal database 33 for each signal or group signals forming the AHP bus indicating the timing of each state change and the value of each signal or signal group between state changes when relevant to a transaction.

The data model 42 defines the bus signal patterns associated with the start and end of each phase of each transaction and indicates an allowable time range for the start and end of each transaction phase relative to the preceding phase. Pattern recognition engine 30 sets an error flag in the transaction database record for any transaction in which a phase fails to occur within an allowed time.

Figure 5:
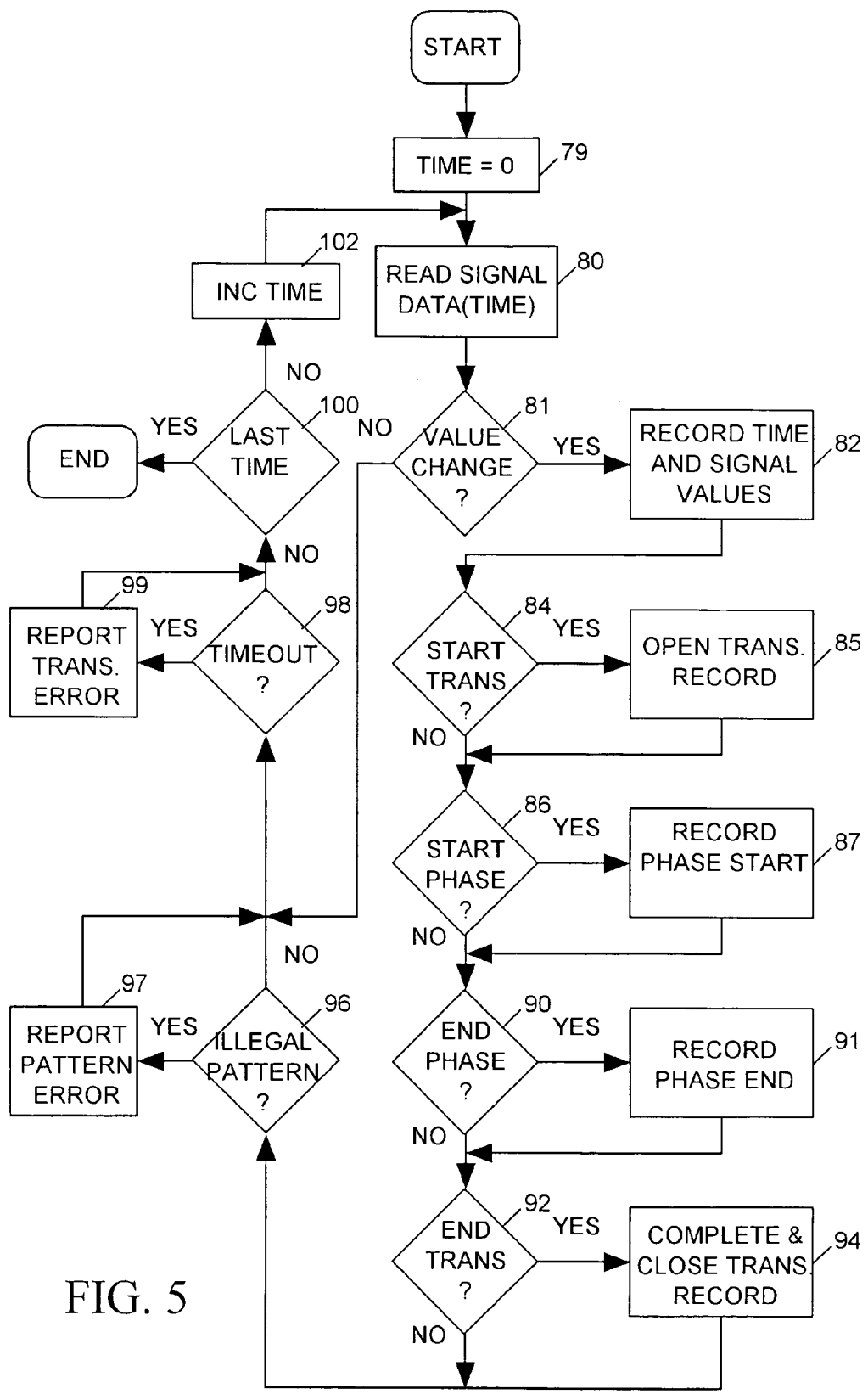
FIG. 5 is a flow chart depicting a bus transaction analysis method in accordance with the invention.

FIG. 5 illustrates an algorithm executed by pattern recognition engine 30 when creating bus transaction and signal database entries for a selected bus. Starting at simulation time 0 (step 80), pattern recognition engine 30 reads the signal data for the bus (step 81) and determines whether any state change in any signal or group of signals of has occurred (step 81). If so, pattern recognition engine 30 records the time and values of the changed signals in database 33 (step 82). Pattern recognition engine 30 then consults data model 42 to determine whether the signal pattern appearing on the bus indicates the start of a bus transaction (step 84) and if so, opens a record in bus transaction database 32 for that transaction (step 85) indicating the nature of the transaction and its starting time. If the signal pattern on the bus represents the start of a transaction phase (step 86), pattern recognition engine 30 records the time the phase started along with relevant information about the phase including data values conveyed on the bus (step 87). When the signal pattern on the bus indicates the end of a transaction phase (step 90) has occurred, pattern recognition engine 30 records the time the phase ended (step 91). If the signal pattern indicates a transaction has completed (step 92), pattern recognition engine 30 closes the transaction record by entering the transaction completion time in the record (step 94).

When pattern recognition engine 30 does not recognize the pattern on the bus as being a legal pattern (step 96), it stores an error flag in transaction database 32 indicting the simulation time of the bus error (step 97). Display engine 34 will later flag the error when that simulation time appears in the display it creates. At step 98, pattern recognition engine 30 also checks each open transaction to determine whether the current phase has failed to end on time or whether a next phase has failed to begin on time and if so, stores an error flag in the database 32 transaction record for that transaction (step 99). Display engine 34 will later flag the file card display associated with that transaction when it discovers the error flag in its transaction record. If the currently selected simulation time is the end of the simulation (step 100) the process ends. Otherwise pattern recognition engine 30 increments simulation time (step 102), and returns to step 81 to read and process the waveform data for the next increment of simulation time.

Thus has been shown and described a system for analyzing waveform data representing states of individual signals forming a bus as functions of time to determine the sequence of transactions occurring on the bus and to produce a display representing that sequence of transactions. The forgoing specification and the drawings depict an exemplary embodiment of the best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for processing a plurality of waveform data sequences generated during a circuit simulation, each corresponding to a separate signal conveyed by a separate net of a plurality of nets within a circuit being simulated, wherein each waveform data sequence represents states of its corresponding signal at a succession of times during the circuit simulation, the method comprising the steps of:
   a. providing a bus signal map mapping selected ones of the waveform data sequences to lines of a bus,
   b. providing a transaction data model corresponding to each kind of transaction that can occur on the bus and describing a characteristic signal pattern appearing on the bus during that transaction; and
   c. processing the bus signal map, the transaction data model and the waveform data sequences corresponding to the lines of the bus to identify transactions occurring on the bus during the simulation, and to identify a time during the circuit simulation in which each identified transaction occurred.

2. The method in accordance with claim 1 further comprising the step of:
   d. generating a display including a separate representation of each identified transaction, wherein a position within the display of each transaction's representation represents the time the transaction occurred on the bus during the simulation.

3. The method in accordance with claim 2 wherein each transaction's representation comprises an index card having edges positioned to represent starting and ending times of the transaction during the simulation.

4. The method in accordance with claim 2 wherein the representation for each transaction having more than one phase includes a representation of each phase positioned to indicate a time that the phase occurred during the simulation.

5. The method in accordance with claim 2
   wherein the transaction data model indicates that states of signals conveyed on subset of the set of nets represent separate bits of a multiple-bit word,
   wherein the display generated at step d also includes representations of successive values of the multiple-bit word during the simulation, and
   wherein a position within the display of each value of the multiple-bit word represents a time at which that value of the multiple-bit word appeared on the bus during the simulation.

6. The method in accordance with claim 5
   wherein at least one transaction's representation indicates a value of data conveyed by the bus during the transaction,
   wherein step b comprises generating the transaction data model by processing a bus protocol specification describing signal protocols employed by circuit modules communicating over the bus during each transaction, and
   wherein step c comprises the substeps of:
      c1. processing the bus signal map to ascertain which waveform data sequences correspond to lines of the bus,
      c2. processing the transaction data models for the transactions to ascertain the characteristic signal patterns for those transactions, and
      c3. processing the waveform data sequences ascertained at step c1 to determine whether characteristic signal patterns ascertained at step c2 appeared on the bus.

7. The method in accordance with claim 2 wherein at least one transaction's representation indicates a value of data conveyed by the bus during the transaction.

8. The method in accordance with claim 1 wherein step b comprises generating the transaction data model by processing a bus protocol specification describing signal protocols employed by circuit modules communicating over the bus during each transaction.

9. The method in accordance with claim 1 wherein step c comprises the substeps of:
   c1. processing the bus signal map to ascertain which waveform data sequences correspond to lines of the bus,
   c2. processing the transaction data models for the transactions to ascertain the characteristic signal patterns for those transactions, and
   c3. processing the waveform data sequences ascertained at step c1 to determine whether any of the characteristic signal patterns ascertained at step c2 appeared on the bus.

10. A method for determining whether portions of a circuit described by a netlist as communicating with one another through a bus will be able to properly carry out a sequence of transactions over the bus, the method comprising the steps of:
   a. programming a simulator to carry out a simulation of the circuit described by the netlist, thereby to produce a dump file containing a plurality of waveform data sequences, each corresponding to a separate signal conveyed by a separate net of a plurality of nets within the circuit, wherein each waveform data sequence represents states of its corresponding signal at a succession of times during the circuit simulation, the method comprising the steps of:
   b. providing a bus signal map mapping selected ones of the waveform data sequences to lines of a bus,
   c. providing a transaction data model corresponding to each kind of transaction that can occur on the bus and describing a characteristic signal pattern appearing on the bus during that transaction; and
   d. processing the bus signal map, the transaction data model and the waveform data sequences corresponding to the lines of the bus to identify transactions occurring on the bus during the simulation, and to identify a time during the circuit simulation in which each identified transaction occurred.

11. The method in accordance with claim 10 further comprising the step of:
   d. generating a display including a separate representation of each identified transaction, wherein a position within the display of each transaction's representation represents the time during which the transaction occurred on the bus during the simulation.

12. The method in accordance with claim 11
   wherein the transaction data model indicates that states of a signals conveyed on subset of the set of nets represent separate bits of a multiple-bit word,
   wherein the display generated at step d also includes representations of successive values of the multiple-bit word during the simulation, and
   wherein a position within the display of each value of the multiple-bit word represents a time at which that value of the multiple-bit word appeared on the bus during the simulation.

13. The method in accordance with claim 12
wherein at least one transaction's representation indicates a value of data conveyed by the bus during the transaction,
wherein step b comprises generating the transaction data model by processing a bus protocol specification describing signal protocols employed by circuit modules communicating over the bus during each transaction, and
wherein step c comprises the substeps of:
c1. processing the bus signal map to ascertain which waveform data sequences correspond to lines of the bus,
c2. processing the transaction data models for the transactions to ascertain the characteristic signal patterns for those transactions, and
c3. processing the waveform data sequences ascertained at step c1 to determine whether any of the characteristic signal patterns ascertained at step c2 appeared on the bus.

14. The method in accordance with claim 11 wherein at least one transaction's representation indicates a value of data conveyed by the bus during the transaction.

15. The method in accordance with claim 11 wherein each transaction's representation comprises an index card having edges positioned to represent starting and ending times of the transaction during the simulation.

16. The method in accordance with claim 11 wherein the representation for each transaction having more than one phase includes a representation of each phase positioned to indicate a time that the phase occurred during the simulation.

17. The method in accordance with claim 10 wherein step c comprises generating the transaction data model by processing a bus protocol specification describing signal protocols employed by circuit modules communicating over the bus during each transaction.

18. The method in accordance with claim 10 wherein step c comprises the substeps of:
c1. processing the bus signal map to ascertain which waveform data sequences correspond to lines of the bus,
c2. processing the transaction data models for the transactions to ascertain the characteristic signal patterns for those transactions, and
c3. processing the waveform data sequences ascertained at step c1 to determine whether any of the characteristic signal patterns ascertained at step c2 appeared on the bus.

19. Computer-readable media, which when read and executed by a computer causes the computer to carry out a method for processing a plurality of waveform data sequences generated during a circuit simulation, each corresponding to a separate signal conveyed by a separate net of a plurality of nets within a circuit being simulated, wherein each waveform data sequence represents states of its corresponding signal at a succession of times during the circuit simulation, for processing a bus signal map mapping selected ones of the waveform data sequences to lines of a bus, and for processing a transaction data model corresponding to each kind of transaction that can occur on the bus and describing a characteristic signal pattern appearing on the bus, the method comprising the steps of:
a. processing the bus signal map to ascertain which waveform data sequences correspond to lines of the bus,
b. processing the transaction data models for the transactions to ascertain the characteristic signal patterns for those transactions, and
c. processing the waveform data sequences ascertained at step a to identify transactions occurring on the bus during the simulation by determining whether characteristic signal patterns ascertained at step b appeared on the bus during the circuit simulation.

20. The computer-readable media in accordance with claim 19 wherein the method further comprising the step of:
d. generating a display including a separate representation of each identified transaction, wherein a position within the display of each transaction's representation represents a time during which the transaction occurred on the bus during the simulation.

21. The computer-readable media in accordance with claim 20
wherein the transaction data model indicates that states of a signals conveyed on subset of the set of nets represent separate bits of a multiple-bit word,
wherein the display generated at step d also includes representations of successive values of the multiple-bit word during the simulation, and
wherein a position within the display of each value of the multiple-bit word represents a time at which that value of the multiple-bit word appeared on the bus during the simulation.

22. The computer-readable media in accordance with claim 20 wherein at least one transaction's representation indicates a value of data conveyed by the bus during the transaction.

23. The method in accordance with claim 20 wherein each transaction's representation comprises an index card having edges positioned to represent starting and ending times of the transaction during the simulation.

24. The method in accordance with claim 20 wherein the representation for each transaction having more than one phase includes a representation of each phase positioned to indicate a time that the phase occurred during the simulation.

* * * * *